(12) United States Patent
YongFeng

(10) Patent No.: US 11,984,175 B2
(45) Date of Patent: May 14, 2024

(54) AUTOMATIC MIRRORED ROM

(71) Applicant: Advanced Micro Devices, Inc., Santa Clara, CA (US)

(72) Inventor: Cai YongFeng, Shanghai (CN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/855,628

(22) Filed: Jun. 30, 2022

(65) Prior Publication Data

US 2023/0386593 A1    Nov. 30, 2023

(30) Foreign Application Priority Data

May 25, 2022    (CN) .......................... 202210575524.8

(51) Int. Cl.
| | |
|---|---|
| *G06F 9/445* | (2018.01) |
| *G11C 17/00* | (2006.01) |
| *G11C 29/04* | (2006.01) |
| *H03K 19/20* | (2006.01) |
| *H03K 19/21* | (2006.01) |

(52) U.S. Cl.
CPC .............. *G11C 29/04* (2013.01); *G11C 17/00* (2013.01); *H03K 19/20* (2013.01); *H03K 19/21* (2013.01)

(58) Field of Classification Search
CPC ................................ G11C 29/04; G11C 17/00
See application file for complete search history.

(56) References Cited

U.S. PATENT DOCUMENTS

| | | | |
|---|---|---|---|
| 8,190,869 B2 * | 5/2012 | Booth ................... | G06F 21/572 726/34 |
| 2020/0201622 A1 * | 6/2020 | Tsujimura ................ | G06F 8/71 |
| 2020/0257521 A1 * | 8/2020 | Jayakumar ............ | G06F 9/4401 |
| 2022/0156410 A1 * | 5/2022 | Ocheretny ............ | G06F 21/556 |
| 2023/0060908 A1 * | 3/2023 | Wang ................... | G06F 9/4408 |

\* cited by examiner

*Primary Examiner* — Min Huang
(74) *Attorney, Agent, or Firm* — Greenberg Traurig, LLP

(57) ABSTRACT

The disclosed method may include detecting, by a control circuit coupled to a first read only memory (ROM) device and a second ROM device, a failure of a first output signal from the first ROM device to a common output. The first ROM device is connected to the common output and the second ROM device is disconnected from the common output. The method also includes switching, by the control circuit in response to detecting the failure, the common output from the first ROM device to the second ROM device. Various other methods, systems, and computer-readable media are also disclosed.

20 Claims, 6 Drawing Sheets

AUTOMATIC MIRRORED ROM

CROSS REFERENCE TO RELATED APPLICATION

This application claims the benefit of China National Intellectual Property Administration Application No. 202210575524.8, titled "A Mirrored SPI ROM Design to Increase System Stability," filed May 25, 2022, the disclosure of which is incorporated, in its entirety, by this reference.

BACKGROUND

A computing device may use a read only memory (ROM) for storing specialized data and/or software, such as firmware. The ROM chip may often be soldered onto a printed circuit board (PCB) of the computing device or otherwise incorporated into the computing device in a manner that may render the ROM chip difficult to replace in the case of any failure with the ROM chip. Thus, many computing devices may incorporate a second ROM chip to serve as a backup ROM.

However, using the backup ROM chip may require a manual process. Detecting the failure of the first ROM chip itself may require manual intervention. Even if the failure may be automatically detected, switching to the second ROM chip may require manual reconfiguration of the device. For example, a user may need to reconfigure the device to use a different chip select pin, update a BIOS of the device, and/or other operations which often requires rebooting the device. Thus, using the backup ROM chip may disrupt a normal operation of the device.

SUMMARY

As will be described in greater detail below, the instant disclosure describes various systems and methods for automatically decoupling a first ROM device from a common output and connecting a second ROM device to the common output in response to detecting a failure of the first ROM device. The second ROM device may mirror the first ROM device to serve as a backup ROM device In one example, a method for automatic ROM switching may include detecting, by a control circuit coupled to a first read only memory (ROM) device and a second ROM device, a failure of a first output signal from the first ROM device to a common output. The first ROM device may be connected to the common output and the second ROM device may be disconnected from the common output. The method may also include switching, by the control circuit in response to detecting the failure, the common output from the first ROM device to the second ROM device.

In some examples, switching the common output from the first ROM device to the second ROM device may be in response to detecting, by the control circuit, a second output signal from the second ROM device. In some examples, detecting the failure of the first output signal may further include comparing, by the control circuit, the first output signal with the second output signal from the second ROM device. In some examples, detecting the failure may further include detecting a logic low signal on the first output signal and a logic high signal on the second output signal. In some examples, detecting the failure of the first output signal may further include evaluating a delayed first output signal with the first output signal.

In some examples, the first ROM device and the second ROM device may operate concurrently. In some examples, the first ROM device and the second ROM device may both connected to a common input. In some examples, the second ROM device may mirror the first ROM device.

In one embodiment, a system for an automatic mirrored ROM may include a first read only memory (ROM) device coupled to a common output, a second ROM device disconnected from the common output, and a control circuit coupled to the first ROM device and the second ROM device, the control circuit configured to detect a failure of the first ROM device on the common output and in response switch the second ROM device to the common output.

In some examples, switching the second ROM device to the common output may further be in response to detecting, by the control circuit, a second output signal from the second ROM device. In some examples, detecting the failure of the first ROM device may further include comparing, by the control circuit, a first output signal of the first ROM device with a second output signal of the second ROM device. In some examples, detecting the failure of the first ROM device may further include detecting at least one of a logic low signal on the first output signal and a logic high signal on the second output signal, a sustained logic signal on the first output signal inconsistent with the second output signal, and the first output signal changing from the logic high signal to the logic low signal inconsistent with the second output signal.

In one embodiment, a system for an automatic mirrored ROM may include at least one physical processor, a physical memory, a first read only memory (ROM) device coupled to a common output, a second ROM device disconnected from the common output, and a control circuit coupled to the first ROM device and the second ROM device, the control circuit configured to automatically couple the second ROM device to the common output in response to detecting a failure of the first ROM device.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
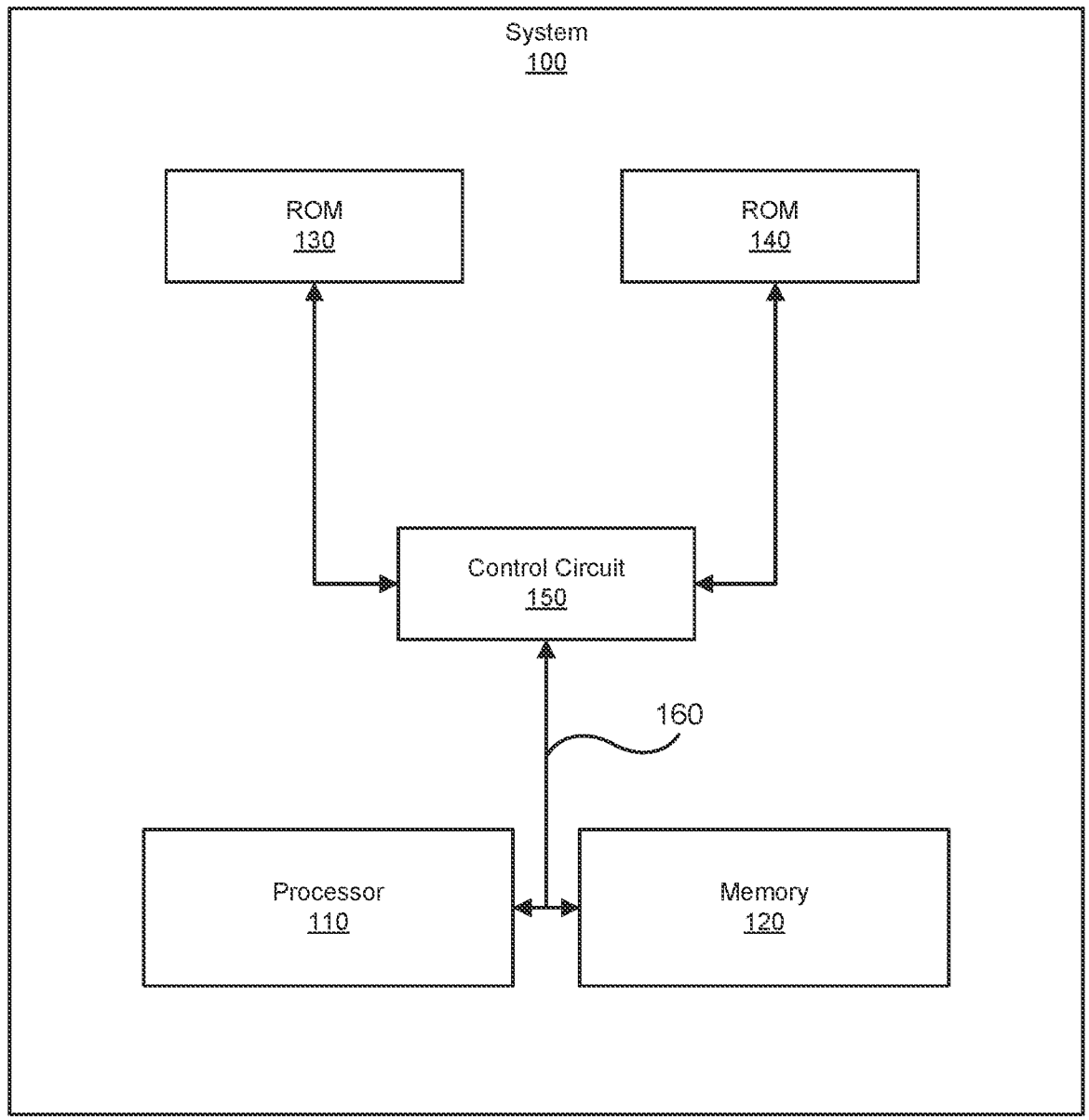
FIG. 1 is a block diagram of an exemplary system an automatic mirrored ROM.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to a dual ROM design that may automatically switch from one ROM chip to the other. As will be explained in greater detail below, embodiments of the present disclosure may detect a failure of a first output signal from the first ROM and in response switch over to a second ROM. The present disclosure provides a device having a mirrored ROM design that may automatically switch from a first ROM to a second ROM when the first ROM fails. Advantageously, the switch may occur seamlessly without requiring a reconfiguration or a reboot of the device.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-4, detailed descriptions of an automatic mirrored ROM. Detailed descriptions of an example system with an automatic mirrored ROM will be provided in connection with FIG. 1. Detailed descriptions of an example circuit for an automatic mirrored ROM and signals thereof will be provided in connection with FIGS. 2A-B. Detailed descriptions of another example circuit for an automatic mirrored ROM and signals thereof will be provided in connection with FIGS. 3A-B. Detailed descriptions of corresponding computer-implemented methods will also be provided in connection with FIG. 4.

FIG. 1 is a block diagram of an example system 100 for a dual ROM design capable of automatic switching. System 100 may correspond to a computing device, such as a desktop computer, a laptop computer, a server, a tablet device, a mobile device, a smartphone, a wearable device, an augmented reality device, a virtual reality device, a network device, and/or an electronic device. As illustrated in FIG. 1, system 100 may include one or more memory devices, such as memory 120. Memory 120 generally represents any type or form of volatile or non-volatile storage device or medium capable of storing data and/or computer-readable instructions. Examples of memory 120 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, and/or any other suitable storage memory.

As illustrated in FIG. 1, example system 100 may include one or more physical processors, such as processor 110. Processor 110 generally represents any type or form of hardware-implemented processing unit capable of interpreting and/or executing computer-readable instructions. In some examples, processor 110 may access and/or modify data and/or instructions stored in memory 120. Examples of processor 110 include, without limitation, microprocessors, microcontrollers, Central Processing Units (CPUs), graphics processing units (GPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, graphics processing units (GPUs), portions of one or more of the same, variations or combinations of one or more of the same, and/or any other suitable physical processor.

As further illustrated in FIG. 1, system 100 may include a control circuit 112, a ROM 114, a ROM 116, and a common output 160. ROM 114 may be a ROM device and, in some examples, ROM 116 may be a mirror of ROM 116 (e.g., having a same speed, size, data, etc.). Control circuit 112 may be coupled to both ROM 114 and ROM 116, and more specifically in some examples an output of ROM 114 and an output of ROM 116. Control circuit 112 may include a switching circuit and/or element for switching between the outputs of ROM 114 and ROM 116 such that one of the outputs of ROM 114 and ROM 116 (e.g., common output 160) may be coupled to processor 110 and/or memory 120 (e.g., to a bus connecting to processor 110 and/or memory 120). In other words, control circuit 150 may control which of the outputs of ROM 130 and ROM 140 are connected to common output 160. Further, in some examples, a common input (e.g., signals sent from processor 110 and/or memory 120) may be coupled to both ROM 130 and ROM 140. For example, any updates to ROM 130 may also be mirrored to ROM 140.

Figure 2A:
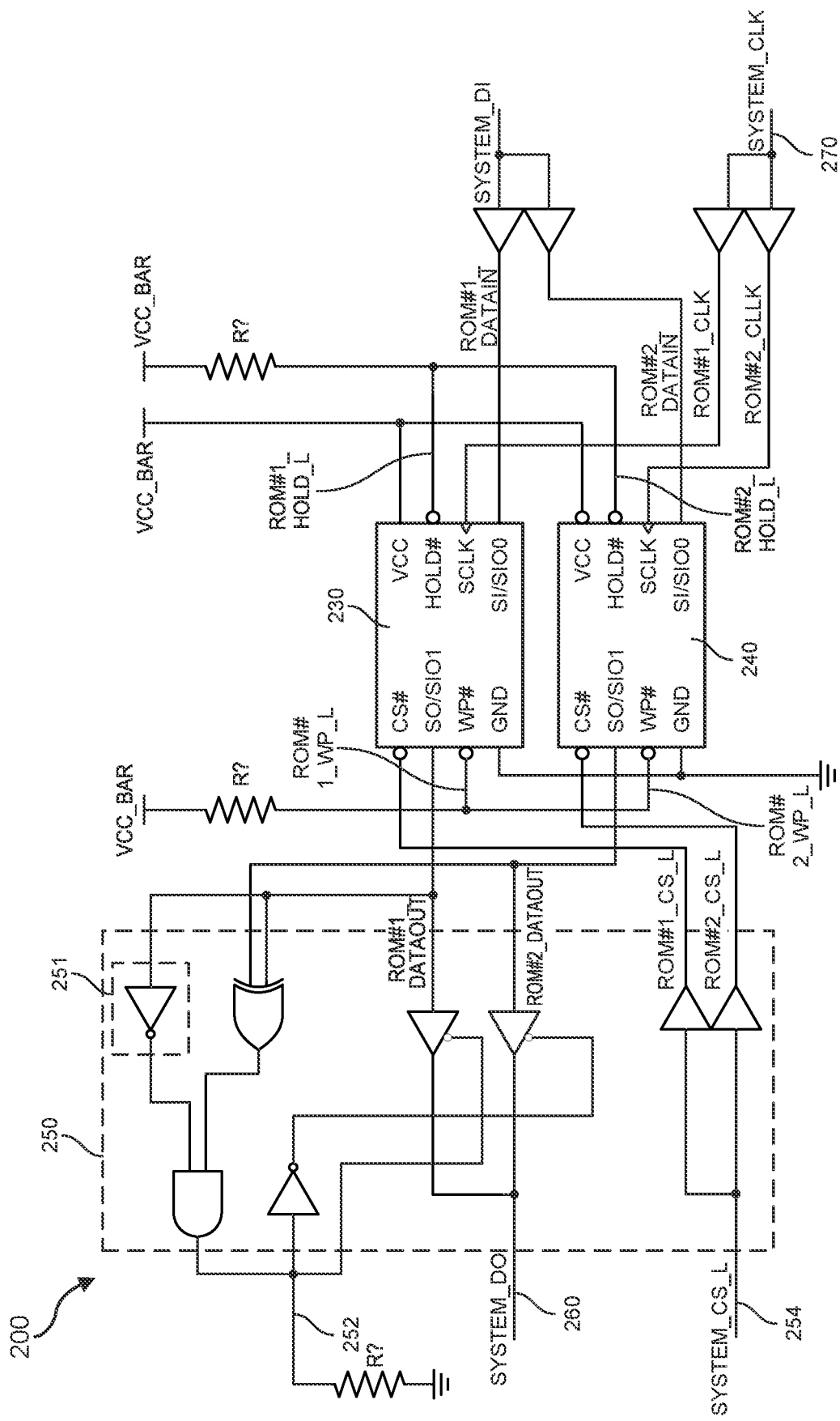
FIG. 2A is a basic circuit diagram of an exemplary automatic mirrored ROM.
Figure 2B:
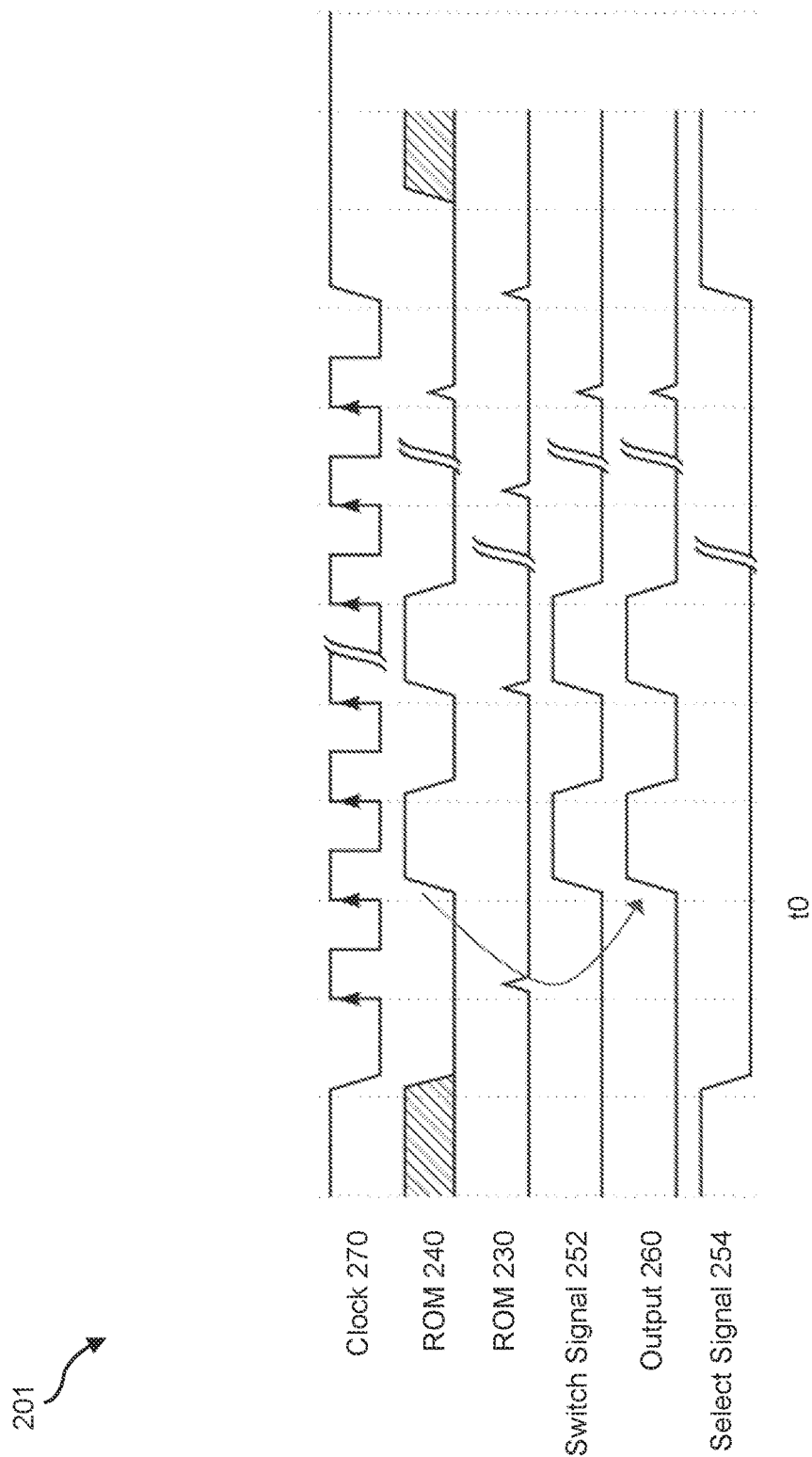
FIG. 2B is a signal diagram corresponding to the circuit of FIG. 2A.

FIG. 2A illustrates an example circuit 200 and FIG. 2B illustrates a signal diagram 201 for circuit 200. Circuit 200 may include a ROM 230 (e.g., ROM #1), which may correspond to ROM 130, a ROM 240 (e.g., ROM #2), which may correspond to ROM 140, and a control circuit 250, which may correspond to control circuit 150. Control circuit 250 may include a logic block 251, which may include an inverter as illustrated in FIG. 2A, for evaluating an output of ROM 230. In other examples, logic block 251 may include other components and/or circuits (see, e.g., FIG. 3A). With further reference to FIG. 2B, various signals are illustrated, including a clock 270, a switch signal 252, an output 260, and a select signal 254. In some examples, one or more components of circuit 200 may communicate via a serial peripheral interface (SPI), although in other examples other interfaces may be used. Circuit 200 illustrates one example of a circuit for an automatic mirrored ROM.

As illustrated in FIG. 2B, clock 270 may provide a clock signal for coordinating various circuit components, for example by synchronizing using the rising edge. At time t0, the output signal of ROM 240 may have a logic high while ROM 230 has a logic low. As described herein, ROM 240 may mirror ROM 230 such that at any given time the same logic signal (e.g., high or low) should be expected. However, at time t0, because ROM 230 outputs logic low when logic high is expected (as indicated by ROM 240), ROM 230 may have experienced a failure that prevents ROM 230 from outputting the expected logic high.

Control circuit 250 may detect the failure of ROM 230 and replace the output of ROM 230 with the output of ROM 240 for output 260, as indicated by the arrow in FIG. 2B. More specifically in the example illustrated in FIG. 2A, control circuit 250 may use switch signal 252. Switch signal 252 may be derived from the outputs of ROM 230 and ROM 240. At time t0, the logic low output from ROM 230 may be inverted by an inverter (or NOT gate) to logic high. The XOR gate may combine the logic low output from ROM 230 and logic high output from ROM 240 to output a logic high (e.g., because the exclusive OR—XOR—may produce a logic high when only one of its two inputs are logic high).

The inverted signal (e.g., logic high at time t0) and the XOR signal (e.g., logic high at time t0) may be combined with an AND gate—which produces a logic high when both of its inputs are logic high—to output switch signal 252 that is logic high at time t0.

As further illustrated in FIG. 2A, control circuit 250 may include active low tri-state buffers—which allows data to pass through when a logic low is applied to its control line—each coupled to the outputs of ROM 230 and ROM 240, respectively, and controlled by switch signal 252. More specifically, switch signal 252 may control the buffer coupled to ROM 230 and switch signal 252 inverted by an inverter may control the buffer coupled to ROM 240. Thus, at time t0, the logic high for switch signal 252 controlling the buffer for ROM 230 may disable the output from ROM 230. Further at time t0, the logic high for switch signal 252, inverted to logic low for controlling the buffer for ROM 240, may enable the output from ROM 240 to output 260. Therefore, control circuit 250 may automatically switch output 260 from ROM 230 to ROM 240 when ROM 230 fails.

Switch signal 252 may only switch output 260 from ROM 230 to ROM 240 when switch signal 252 is logic high. When switch signal 252 is logic low, the buffer for ROM 230 may be enabled and the buffer for ROM 240 may be disabled (e.g., because switch signal 252 is inverted to logic high). In cases where ROM 230 outputs logic high and ROM 240 outputs logic low (which may indicate a failure of ROM 240), the first inverter coupled to ROM 230 produces a logic low signal input into the AND gate such that switch signal 252 is logic low. In cases where ROM 230 and ROM 240 output the same signal (e.g., both logic high or both logic low), the XOR gate produces a logic low signal input into the AND gate such that switch signal 252 is logic low.

In some examples, control circuit 250 may also use select signal 254 for selecting between ROM 230 and ROM 240. Select signal 254 may, in some examples, correspond to a chip select signal for SPI, which may instruct which component (e.g., between ROM 230 and ROM 240) should send data and which component should be disconnected from the SPI bus. In some examples, the chip select may be an active low logic such that when select signal 254 is logic high, ROM 230 may be connected (and ROM 240 disconnected) and when select signal 254 is logic low, ROM 230 may be disconnected (and ROM 240 connected).

Figure 3A:
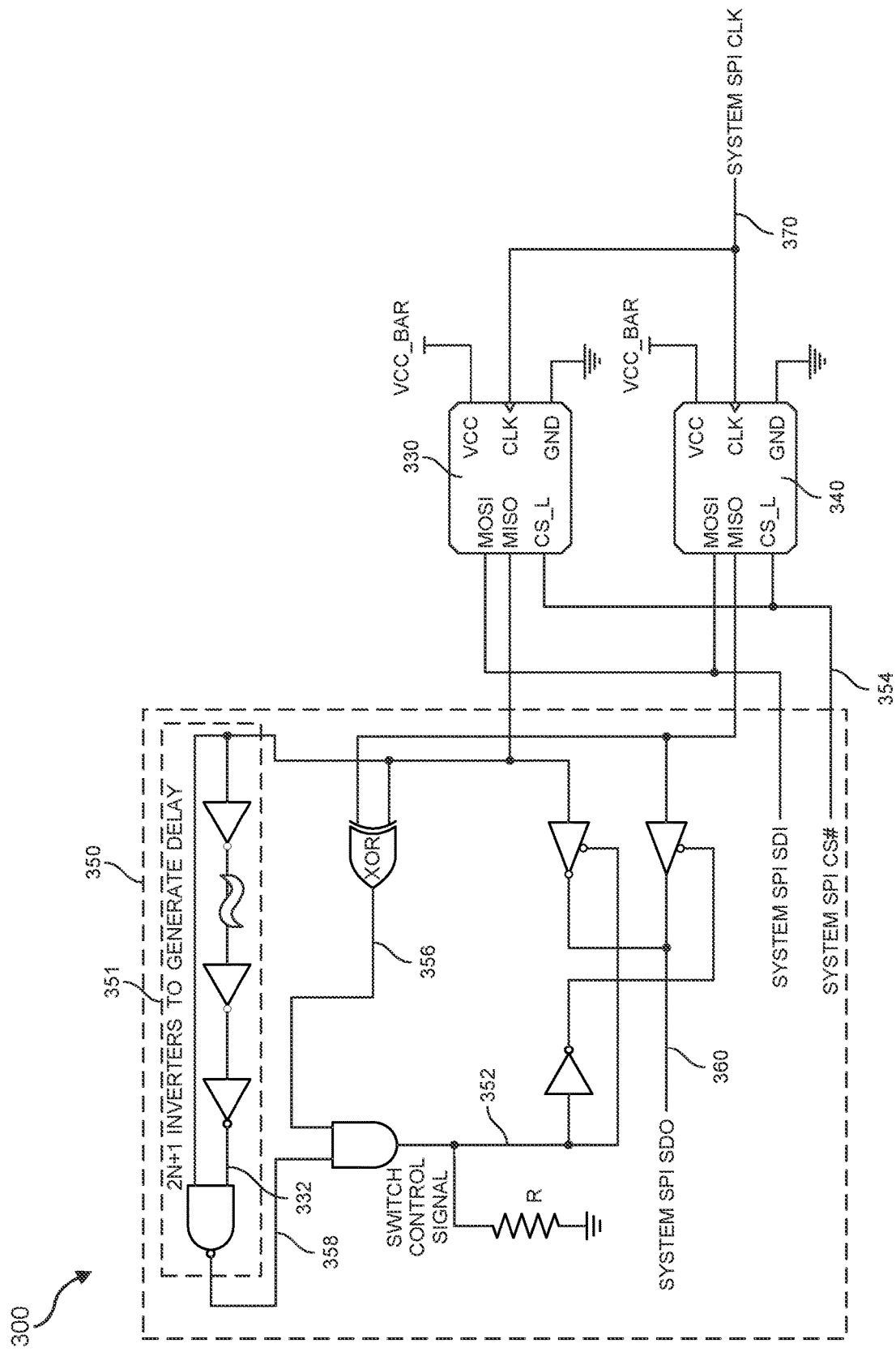
FIG. 3A is a basic circuit diagram of an exemplary automatic mirrored ROM.
Figure 3B:
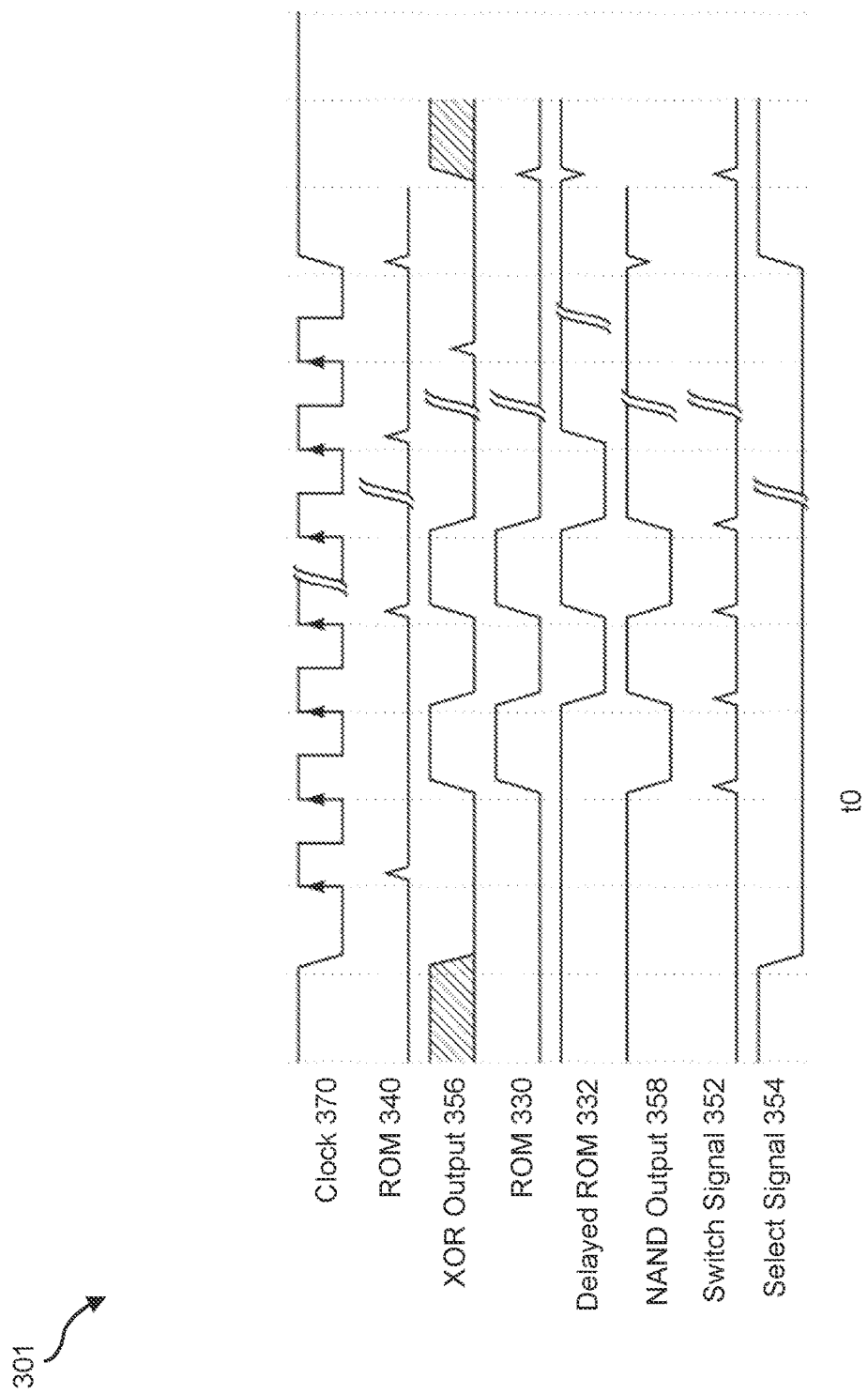
FIG. 3B is a signal diagram corresponding to the circuit of FIG. 3A.

FIG. 3A illustrates an example circuit 300 and FIG. 3B illustrates a signal diagram 301 for circuit 300. Circuit 300 may include a ROM 330 (e.g., ROM #1), which may correspond to ROM 130, a ROM 340 (e.g., ROM #2), which may correspond to ROM 140, and a control circuit 350, which may correspond to control circuit 150. Control circuit 350 may include a logic block 351 for evaluating an output of ROM 330. As illustrated in FIG. 3A, logic block 351 may include a NAND gate as well as 2N+1 inverters, with N being an integer that corresponds to a desired amount of signal delay (e.g., a clock cycle or other amount of delay). With further reference to FIG. 3B, various signals are illustrated, including a clock 370, an XOR output 356, a delayed ROM 332, a NAND output 358, a switch signal 352, a select signal 354, and an output 360. In some examples, one or more components of circuit 300 may communicate via SPI, although in other examples other interfaces may be used.

Circuit 300 illustrates another example of a circuit for an automatic mirrored ROM, which may be a variation of and operate similarly to circuit 200 but with the addition of a delayed output signal for ROM 330 (e.g., delayed ROM 332) for determining a failure of ROM 330 and/or preventing a failure of ROM 340 from triggering a switch. The output of ROM 330 and delayed ROM 332, which may be the output of ROM 330 delayed by a single clock cycle and inverted, may be input into a NAND gate—which produces a logic low only when both of its inputs are logic high—to produce NAND output 358. ROM 330 and delayed ROM 332 being both logic high indicates that the output of ROM 330 changed from logic low at the previous cycle to logic high at the current cycle (e.g., at time t0 in FIG. 3B), which does not indicate a failure such that logic low for NAND output 358 does not indicate failure.

Switch signal 352 is output from an AND combination of NAND output 358 and XOR output 356. Similar to switch signal 252, switch signal 352 may only switch output 360 from ROM 330 to ROM 340 when switch signal 352 is high. Thus, a logic low from NAND output 358 may not trigger the switch.

NAND output 358 may be logic high when ROM 330 and delayed ROM 332 are both logic low or when ROM 330 and delayed ROM 332 are different. ROM 330 and delayed ROM 332 being both logic low indicates that the output of ROM 330 went from logic high at the previous cycle to logic low at the current cycle, which could indicate a failure of ROM 330 (e.g., a failure after the previous cycle) such that logic high for NAND output 358 could indicate a failure of ROM 330. However, ROM 330 and delayed ROM 332 being different may not necessarily be indicative of failure, as the difference could be due a valid sustained logic low or logic high in the output. XOR output 356 may be indicative of whether the sustained logic low or logic high is valid.

As seen in FIG. 3A, XOR output 356 may be an XOR combination of ROM 330 and ROM 340. XOR output 356 may only be logic high when ROM 330 and ROM 340 outputs different signals, which may indicate that one of ROM 330 and ROM 340 has failed. Thus, if XOR output 356 is logic low (indicating the ROM 330 and ROM 340 output the same signal) and NAND output 358 is logic high (e.g., the sustained logic low or logic high of ROM 330 is validated by XOR output 356), switch signal 352 will be logic low such that the switch will not occur. However, XOR output 356 being logic high (indicating a failure of one of ROM 330 and ROM 340) and NAND output 358 being logic high (e.g., the sustained logic low or logic high of ROM 330 is not validated by XOR output 356), switch signal 352 will be logic high such that the switch will automatically occur. In other words, if ROM 330 sustains a logic signal or changes from logic high to logic low inconsistently with ROM 340, control circuit 350 may automatically switch output 360 from ROM 330 to ROM 340.

FIGS. 3A and 3B further illustrate how a failure of ROM 340 may also prevent control circuit 350 from switching output 360 from ROM 330 to ROM 340. A failure of ROM 340 may exhibit a continuous logic low output from ROM 340, as illustrated in FIG. 3B. Although XOR output 356 may indicate a difference between the outputs of ROM 330 and ROM 340 (such as at time t0), NAND output 358 may indicate valid activity from ROM 330. For example, if ROM 340 fails and produces only logic low, ROM 330 changing from logic low to logic high (producing a logic low NAND output 358, which further produces a logic low switch signal 352 as seen at time t0) may prevent the switch.

In some examples, control circuit 350 may also use select signal 354 for selecting between ROM 330 and ROM 340. Select signal 354 may, in some examples, correspond to a chip select signal for SPI, which may instruct which component (e.g., between ROM 330 and ROM 340) should send data and which component should be disconnected from the SPI bus. In some examples, the chip select may be an active low logic such that when select signal 354 is logic high, ROM 330 may be connected (and ROM 340 disconnected) and when select signal 354 is logic low, ROM 330 may be disconnected (and ROM 340 connected).

Figure 4:
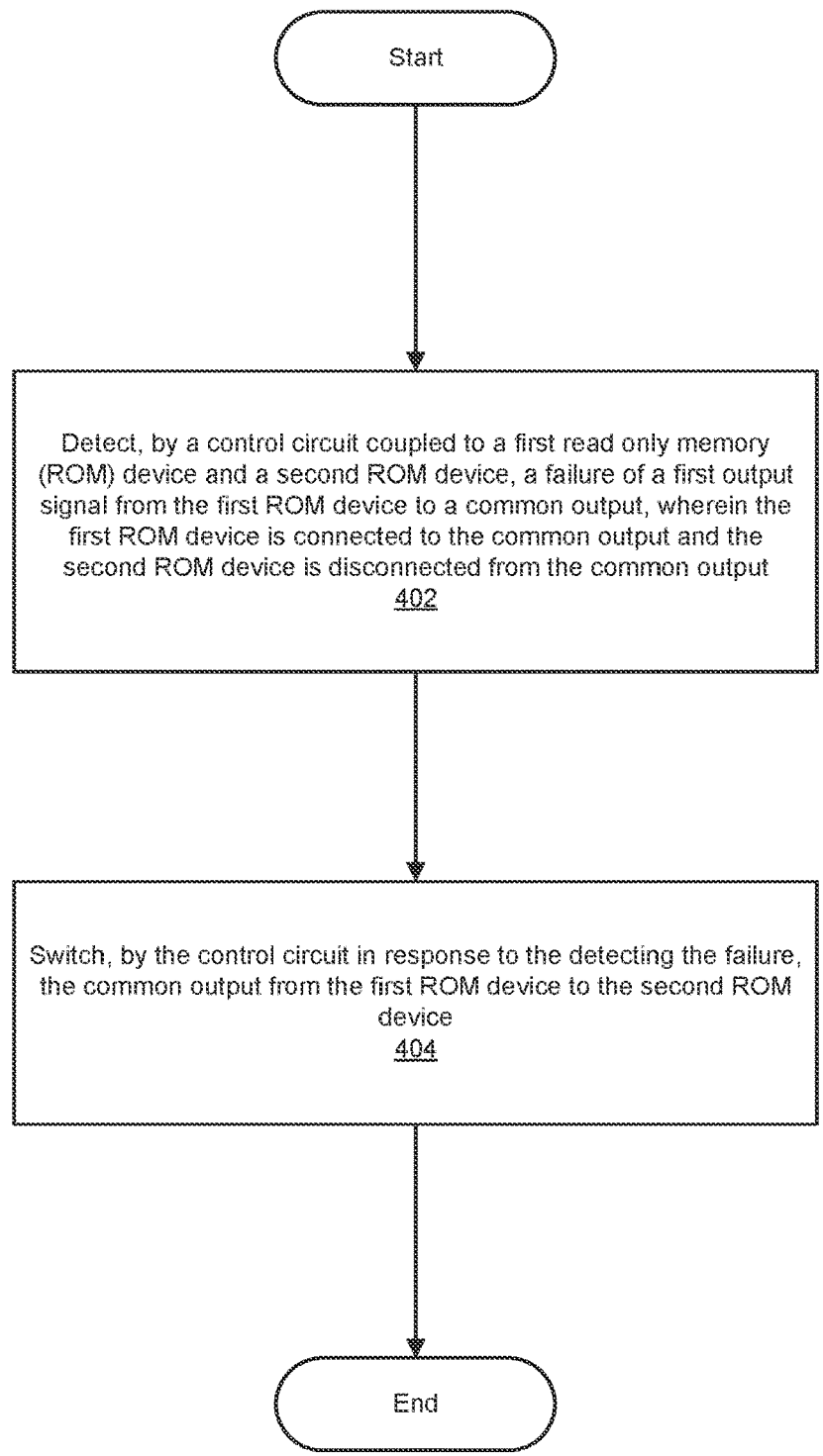
FIG. 4 is a flow diagram of an exemplary method for automatically switching for a mirrored ROM design.

FIG. 4 is a flow diagram of an exemplary computer-implemented method 400 for automatic switching of ROM devices. The steps shown in FIG. 4 may be performed by any suitable computer-executable code and/or computing system, including the system(s) illustrated in FIGS. 1, 2A, and/or 3A. In one example, each of the steps shown in FIG. 4 may represent an algorithm whose structure includes and/or is represented by multiple sub-steps, examples of which will be provided in greater detail below.

As illustrated in FIG. 4, at step 402 one or more of the systems described herein may detect, by a control circuit coupled to a first read only memory (ROM) device and a second ROM device, a failure of a first output signal from the first ROM device to a common output. The first ROM device may be connected to the common output and the second ROM device may be disconnected from the common output. For example, the output of ROM 130 may be connected to common output 160 whereas the output of ROM 140 may be disconnected from common output 160. Control circuit 150 may detect the failure of the output signal from ROM 130.

The systems described herein may perform step 402 in a variety of ways. In one example, the first ROM device and the second ROM device may operate concurrently. In addition, the first ROM device and the second ROM device may both be connected to a common input such that any data input into the first ROM device may be input into the second ROM device. More specifically, the second ROM device may mirror the first ROM device. For example, ROM 140 may share a same size, speed, data, etc. as ROM 130 in order to serve as a backup ROM for ROM 130. In addition, Thus, ROM 130 and ROM 140 may operate and/or behave the same, although only one ROM may output to common output 160.

In some examples, detecting the failure of the first output signal from the first ROM device may further include comparing, by the control circuit, the first output signal with the second output signal from the second ROM device. For instance, detecting the failure of the first output signal from the first ROM device may include detecting a logic low signal on the first output signal and a logic high signal on the second output signal.

Because ROM 130 and ROM 140 may be designed to behave the same, any difference between outputs may be indicative of a failure or ROM 130 or ROM 140. For example, if ROM 140 outputs a logic high signal (indicating output data) while ROM 130 outputs a logic low signal when a logic high signal is expected (as indicated by ROM 140), this difference in outputs may indicate that ROM 130 is exhibiting a failure.

In some examples, detecting the failure of the first ROM may include detecting at least one of a sustained logic signal on the first output signal inconsistent with the second output signal, and the first output signal changing from the logic high signal to the logic low signal inconsistent with the second output signal. As described above (see, e.g., FIGS. 3A and 3B), if ROM 130 outputs a same logic signal in a previous clock cycle and a current clock cycle that is inconsistent with an output of ROM 140 in the current clock cycle, control circuit 150 may switch common output 160 from ROM 130 to ROM 140. In addition, if ROM 130 outputs a logic high in the previous clock cycle and a logic low in the current clock cycle and ROM 140 outputs a logic high in the current clock cycle, control circuit 150 may switch common output 160.

In yet other examples, control circuit 150 may detect a failure in ROM 130 in other ways, such as detecting a weak (e.g., not reaching a logic high) and/or corrupted signal, unexpected delays in signals, detecting failures via one or more sensors, etc.

At step 404 one or more of the systems described herein may switch, by the control circuit in response to detecting the failure, the common output from the first ROM device to the second ROM device. For example, control circuit 150 may, automatically in response to detecting the failure, decouple ROM 130 from common output 160 and connected ROM 140 to common output 160.

The systems described herein may perform step 404 in a variety of ways. In one example, switching the common output from the first ROM device to the second ROM device may further be in response to detecting, by the control circuit, a second output signal from the second ROM device. For example, as described above, control circuit 150 may detect a logic high signal from ROM 140 while ROM 130 outputs a logic low or no signal.

In other examples, control circuit 150 may further determine that ROM 140 has also not failed or prevent switching if ROM 140 has failed. For example, detecting a logic low output from ROM 130 in a previous clock cycle and a logic high output from ROM 130 in a current clock cycle may prevent control circuit 150 from switching common output 160 despite ROM 140 outputting a logic low signal in the current clock cycle (inconsistent with ROM 130).

As described above, many server/workstation designs may have a dual SPI ROM design to increase system stability. The dual ROM design may provide a backup ROM if the primary ROM fails. However, the two ROM may reside on different chip select pins, so when one ROM gets damaged or otherwise fails, the user may need to reboot the system and the firmware may require updating to fetch code from the other ROM by using a different chip select pin. The present disclosure allows the ROM to switch transparently to the end user. If one ROM becomes damaged, the systems described herein may automatically switch to the backup ROM, without needing to power down or reboot or change the BIOS code.

The present disclosure provides a mirrored SPI ROM design, the second ROM being a backup chip. When the primary ROM becomes damaged or otherwise fails, the systems described herein may detect the failure (e.g., by detecting no output from the primary ROM) automatically switch to the backup ROM, so that the system may still fetch code from backup ROM without requiring a power down or reboot to change ROM. This may advantageously help increase the system stability.

This design allows the dual ROM to act as mirrored ROMs, sharing the same SPI bus signals and same chip select pin. However, only one ROM may be providing data output at a time, such that the second ROM serves as a backup and may be connected as needed. When the primary ROM fails, the system may automatically switch to second (backup) ROM. To further improve current dual SPI ROM designs, the system can keep power on while switching from the bad ROM to the good ROM. Such a design may be advantageous for system requiring long run times or may otherwise not easily reboot or power down. In addition, the switch may be prevented if the second ROM fails.

As detailed above, the computing devices and systems described and/or illustrated herein broadly represent any type or form of computing device or system capable of executing computer-readable instructions. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SOCs), digital signal processors (DSPs), Neural Network Engines (NNEs), accelerators, graphics processing units (GPUs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   detecting, by a control circuit coupled to a first read only memory (ROM) device and a second ROM device, a first output signal from the first ROM device and a second output signal from the second ROM device, wherein the first ROM device is connected to a common output for outputting the first output signal as a common output signal and the second ROM device is disconnected from the common output;
   detecting, by the control circuit, a failure of the first output signal; and
   switching, by the control circuit in response to detecting the failure, the common output from the first ROM device to the second ROM device to continue outputting the common output signal without a system interruption that causes a system reboot.

2. The method of claim 1, wherein switching the common output from the first ROM device to the second ROM device is further in response to:
   comparing, by the control circuit, the first output signal with the second output signal from the second ROM device.

3. The method of claim 2, wherein detecting the failure of the first output signal from the first ROM device further comprises detecting a logic low signal on the first output signal and a logic high signal on the second output signal.

4. The method of claim 2, wherein detecting the failure of the first output signal from the first ROM further comprises evaluating a delayed first output signal with the first output signal.

5. The method of claim 1, wherein the first ROM device and the second ROM device operate concurrently.

6. The method of claim 1, wherein the first ROM device and the second ROM device are both connected to a common input.

7. The method of claim 1, wherein the second ROM device mirrors the first ROM device.

8. A system comprising:
   a common output for outputting a common output signal;
   a first read only memory (ROM) device coupled to the common output;
   a second ROM device disconnected from the common output; and
   a control circuit coupled to the first ROM device and the second ROM device, the control circuit configured to:
   detect a failure of the first ROM device on the common output; and
   in response to detecting the failures of the first ROM device, switch the second ROM device to the common output to continue outputting the common output signal without a system interruption that causes a system reboot.

9. The system of claim 8, wherein detecting the failure of the first ROM device further comprises comparing, by the control circuit, a first output signal of the first ROM device with a second output signal of the second ROM device.

10. The system of claim 9, wherein detecting the failure of the first ROM device further comprises detecting at least one of:
- a logic low signal on the first output signal and a logic high signal on the second output signal,
- a sustained logic signal on the first output signal inconsistent with the second output signal, and
- the first output signal changing from the logic high signal to the logic low signal inconsistent with the second output signal.

11. The system of claim 8, wherein the first ROM device and the second ROM device operate concurrently.

12. The system of claim 8, wherein the second ROM device mirrors the first ROM device.

13. The system of claim 8, wherein the first ROM device and the second ROM device are both connected to a common input.

14. A system comprising:
- at least one physical processor;
- a physical memory;
- a common output for outputting a common output signal;
- a first read only memory (ROM) device coupled to the common output;
- a second ROM device disconnected from the common output; and
- a control circuit coupled to the first ROM device and the second ROM device, the control circuit configured to automatically couple the second ROM device to the common output in response to detecting a failure of the first ROM device to continue outputting the common output signal without a system interruption that causes a system reboot.

15. The system of claim 14, wherein detecting the failure of the first ROM device further comprises comparing, by the control circuit, a first output signal of the first ROM device with a second output signal of the second ROM device.

16. The system of claim 15, wherein detecting the failure of the first ROM device further comprises detecting at least one of:
- a logic low signal on the first output signal and a logic high signal on the second output signal,
- a sustained logic signal on the first output signal inconsistent with the second output signal, and
- the first output signal changing from the logic high signal to the logic low signal inconsistent with the second output signal.

17. The system of claim 14, wherein the first ROM device and the second ROM device operate concurrently.

18. The system of claim 14, wherein the first ROM device and the second ROM device are both connected to a common input.

19. The system of claim 14, wherein the second ROM device mirrors the first ROM device.

20. The system of claim 8, wherein the common output signal corresponds to a delayed output from at least one of the first ROM device and the second ROM device.

* * * * *